(12) United States Patent
Sun et al.

(10) Patent No.: US 10,020,170 B2
(45) Date of Patent: *Jul. 10, 2018

(54) CHEMISTRY COMPATIBLE COATING MATERIAL FOR ADVANCED DEVICE ON-WAFER PARTICLE PERFORMANCE

(71) Applicant: Applied Materials, Inc., Santa Clara, CA (US)

(72) Inventors: Jennifer Y. Sun, Mountain View, CA (US); Biraja P. Kanungo, San Jose, CA (US); Dmitry Lubomirsky, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/084,299

(22) Filed: Mar. 29, 2016

(65) Prior Publication Data

US 2016/0211121 A1    Jul. 21, 2016

Related U.S. Application Data

(63) Continuation of application No. 13/830,608, filed on Mar. 14, 2013, now Pat. No. 9,343,289.

(Continued)

(51) Int. Cl.
*C23C 4/10* (2016.01)
*H01J 37/32* (2006.01)
(Continued)

(52) U.S. Cl.
CPC ...... *H01J 37/32495* (2013.01); *C04B 41/009* (2013.01); *C04B 41/5042* (2013.01);
(Continued)

(58) Field of Classification Search
CPC .......... C23C 4/11; C23C 4/134; H01L 21/02; C04B 35/00; C04B 35/505
(Continued)

(56) References Cited

U.S. PATENT DOCUMENTS 5,316,585 A    5/1994  Okamoto et al.
5,766,693 A *  6/1998  Rao ........................ C23C 4/134
                                                      427/453

(Continued)

FOREIGN PATENT DOCUMENTS

CN    1938452 A      3/2007
CN    101239771 A    10/2008
(Continued)

OTHER PUBLICATIONS

International Search Report & Written Opinion of the International Searching Authority dated Oct. 18, 2013, in International Application No. PCT/US2013/052195.

(Continued)

*Primary Examiner* — Dah-Wei D. Yuan
*Assistant Examiner* — Nga Leung V Law
(74) *Attorney, Agent, or Firm* — Lowenstein Sandler LLP

(57) ABSTRACT

A method includes feeding powder comprising a yttrium oxide into a plasma spraying system, wherein the powder comprises a majority of donut-shaped particles, each of the donut-shaped particles having a spherical body with indentations on opposite sides of the spherical body. The method further includes plasma spray coating an article to apply a ceramic coating onto the article, wherein the ceramic coating comprises the yttrium oxide, wherein the donut-shaped particles cause the ceramic coating to have an improved morphology and a decreased porosity as compared to pow- (Continued)

der particles of other shapes, wherein the improved surface morphology comprises a reduced amount of surface nodules.

18 Claims, 12 Drawing Sheets

Related U.S. Application Data

(60) Provisional application No. 61/676,818, filed on Jul. 27, 2012.

(51) Int. Cl.
| | | |
|---|---|---|
| *H01L 21/02* | (2006.01) | |
| *C04B 41/87* | (2006.01) | |
| *C04B 41/00* | (2006.01) | |
| *C04B 41/50* | (2006.01) | |
| *C23C 4/11* | (2016.01) | |
| *C23C 4/134* | (2016.01) | |
| *H01L 21/67* | (2006.01) | |

(52) U.S. Cl.
CPC ............... *C04B 41/87* (2013.01); *C23C 4/11* (2016.01); *C23C 4/134* (2016.01); *H01J 37/32477* (2013.01); *H01L 21/02* (2013.01); *H01L 21/67017* (2013.01); *Y10T 428/2495* (2015.01); *Y10T 428/24413* (2015.01); *Y10T 428/24975* (2015.01); *Y10T 428/252* (2015.01)

(58) Field of Classification Search
USPC .................................................. 427/446, 453
See application file for complete search history.

(56) References Cited

U.S. PATENT DOCUMENTS

| | | | |
|---|---|---|---|
| 7,300,537 | B2 | 11/2007 | O'Donnell et al. |
| 7,648,782 | B2 | 1/2010 | Kobayashi et al. |
| 7,696,117 | B2 | 4/2010 | Sun et al. |
| 8,034,734 | B2 | 10/2011 | Sun et al. |
| 8,206,829 | B2 | 6/2012 | Sun et al. |
| 8,367,227 | B2 | 2/2013 | Sun et al. |
| 9,034,199 | B2 | 5/2015 | Duan et al. |
| 9,090,046 | B2 | 7/2015 | Sun et al. |
| 9,212,099 | B2 | 12/2015 | Sun et al. |
| 2002/0038690 | A1 | 4/2002 | Minato et al. |
| 2005/0037193 | A1 | 2/2005 | Sun et al. |
| 2005/0084654 | A1* | 4/2005 | Takahashi ............... C23C 4/02 428/143 |
| 2005/0136188 | A1 | 6/2005 | Chang |
| 2005/0271984 | A1* | 12/2005 | Brueckner ............ C23C 14/564 430/323 |
| 2007/0110915 | A1 | 5/2007 | Kitamura et al. |
| 2008/0029032 | A1 | 2/2008 | Sun et al. |
| 2008/0108225 | A1 | 5/2008 | Sun et al. |
| 2008/0213496 | A1* | 9/2008 | Sun ........................ C23C 4/18 427/453 |
| 2008/0264564 | A1 | 10/2008 | Sun et al. |
| 2008/0264565 | A1 | 10/2008 | Sun et al. |
| 2009/0036292 | A1 | 2/2009 | Sun et al. |
| 2009/0214825 | A1 | 8/2009 | Sun et al. |
| 2010/0048379 | A1* | 2/2010 | Thippareddy .......... C01G 25/00 501/134 |
| 2010/0119843 | A1 | 5/2010 | Sun et al. |
| 2010/0129670 | A1 | 5/2010 | Sun et al. |
| 2010/0160143 | A1 | 6/2010 | Sun et al. |
| 2011/0198034 | A1 | 8/2011 | Sun et al. |
| 2012/0034469 | A1 | 2/2012 | Sun et al. |
| 2012/0100300 | A1* | 4/2012 | Gindrat ................ H05H 1/3405 427/446 |
| 2012/0104703 | A1 | 5/2012 | Sun et al. |
| 2012/0125488 | A1 | 5/2012 | Sun et al. |
| 2013/0216783 | A1 | 8/2013 | Duan et al. |
| 2013/0216821 | A1 | 8/2013 | Sun et al. |
| 2013/0224498 | A1 | 8/2013 | Sun et al. |
| 2013/0273313 | A1 | 10/2013 | Sun et al. |
| 2013/0273327 | A1 | 10/2013 | Sun et al. |
| 2013/0284373 | A1 | 10/2013 | Sun et al. |
| 2013/0288037 | A1 | 10/2013 | Sun et al. |
| 2014/0030486 | A1 | 1/2014 | Sun et al. |
| 2014/0030533 | A1 | 1/2014 | Sun et al. |
| 2014/0154465 | A1 | 6/2014 | Sun et al. |
| 2014/0349073 | A1 | 11/2014 | Sun et al. |
| 2014/0363596 | A1 | 12/2014 | Sun et al. |
| 2014/0377504 | A1 | 12/2014 | Sun et al. |
| 2015/0021324 | A1 | 1/2015 | Sun et al. |
| 2015/0024155 | A1 | 1/2015 | Sun et al. |
| 2015/0075714 | A1 | 3/2015 | Sun et al. |
| 2015/0079370 | A1 | 3/2015 | Sun et al. |
| 2015/0133285 | A1 | 5/2015 | Sun et al. |
| 2015/0158775 | A1 | 6/2015 | Sun et al. |
| 2015/0218057 | A1 | 8/2015 | Duan et al. |
| 2015/0270108 | A1 | 9/2015 | Sun et al. |
| 2015/0299050 | A1 | 10/2015 | Sun et al. |
| 2015/0307982 | A1 | 10/2015 | Firouzdor et al. |
| 2015/0311043 | A1 | 10/2015 | Sun et al. |
| 2015/0311044 | A1 | 10/2015 | Sun et al. |
| 2015/0321964 | A1 | 11/2015 | Sun et al. |
| 2015/0329430 | A1 | 11/2015 | Sun et al. |
| 2015/0329955 | A1 | 11/2015 | Sun et al. |

FOREIGN PATENT DOCUMENTS

| | | |
|---|---|---|
| CN | 101357846 A | 2/2009 |
| CN | 101772589 A | 7/2010 |
| JP | 2002-087878 A | 3/2002 |
| JP | 2011137194 A * | 7/2011 |
| KR | 2007-0121561 A | 12/2007 |
| KR | 10-2010-0131306 | 12/2010 |
| WO | WO2013126466 A1 | 8/2013 |
| WO | WO2013155220 A1 | 10/2013 |
| WO | WO2013162909 A1 | 10/2013 |
| WO | WO2014018830 A1 | 1/2014 |
| WO | WO2014018835 A1 | 1/2014 |
| WO | WO2014190211 A1 | 11/2014 |
| WO | WO2014197203 A1 | 12/2014 |
| WO | WO2014205212 A1 | 12/2014 |
| WO | WO2015009745 A1 | 1/2015 |
| WO | WO2015013070 A1 | 1/2015 |
| WO | WO2015042196 A1 | 3/2015 |
| WO | WO2015073458 A1 | 5/2015 |
| WO | WO2015164263 A1 | 10/2015 |
| WO | WO2015164638 A1 | 10/2015 |
| WO | WO2015171801 A1 | 11/2015 |
| WO | WO2015175987 A1 | 11/2015 |

OTHER PUBLICATIONS

Taffner et al., "Preparation and Microstructural Analysis of High-Performance Ceramics," ASM Handbook vol. 9: Metallography and Microstructures, 2004, 11 pages, ASM International, Materials Park, Ohio, USA.
Bhatia et al., "Mechanisms of ceramic coating deposition in solution-precurosr plasma spray," J.Mater. Res., vol. 17, No. 9, Sep. 2002, 10 pages, Materials Research Society, Warrendale, PA, USA.
Hass et al., "Gas jet assisted vapor deposition of yttria stabilized zirconia," Department of Materials Science and Engineering, School of Engineering and Applied Science, published Feb. 27, 2009 University of Virginia, Charlottesville, Virginia.
Di Girolamo et al., "Microstructure and thermal properties of plasma-sprayed ceramic thermal barrier coatings," Energia, Ambiente e Innovazione, Published Jan.-Feb. 2013.
Bergant et al., "Porosity evaluation of flame-sprayed and heat-treated coatings using image analysis," Image Anal Stereol 2011;30:53-62, Published Jan. 27, 2011.
Smith et al., "Very Low Pressure Plasma Spray—A Review of an Emerging Technology in the Thermal Spray Community," Coatings 2011, 1, 117-132, doi: 10.3390/coatings1020117, Published Dec. 20, 2011.

(56) References Cited

OTHER PUBLICATIONS

Zircotec—"Optimised performance in high-termperature environments", 2 pages, Plasma sprayed ceramic thermal coatings, downloaded from http://www.zircotec.com/page/plasma-spray-processing/39, on Apr. 4, 2014.

Nakamura et al., "Effects of Pores on Mechanical Properties of Plasma-Sprayed Ceramic Coatings," J. Am. Ceram. Soc., 83 [3] 578-84, Mar. 2000.

Govindarajan et al., "In situ Particle Generation and Splat Formation During Solution Precursor Plasma Spraying of Yttria-Stabilized Zirconia Coatings," J Am. Ceram. Soc., 1-9 (2011).

Kitamura et al., "Structural, Mechanical and Erosion Properties of Yttrium Oxide Coatings by Axial Suspension Plasma Spraying for Electronics Applications," Journal of Thermal Spray Technology, 20:170-185, Jan. 2011.

\* cited by examiner

CHEMISTRY COMPATIBLE COATING MATERIAL FOR ADVANCED DEVICE ON-WAFER PARTICLE PERFORMANCE

PRIORITY CLAIM

This application is a Continuation application of U.S. patent application Ser. No. 13/830,608, filed Mar. 14, 2013, which claims the benefit of U.S. Provisional Application Ser. No. 61/676,818 filed on Jul. 27, 2012, both of which are hereby incorporated by reference.

TECHNICAL FIELD

Embodiments of the present disclosure relate, in general, to ceramic coated articles and to a process for applying a ceramic coating to dielectric etch processing components.

BACKGROUND

In the semiconductor industry, devices are fabricated by a number of manufacturing processes producing structures of an ever-decreasing size. Some manufacturing processes such as plasma etch and plasma clean processes expose a substrate to a high-speed stream of plasma to etch or clean the substrate. The plasma may be highly corrosive, and may corrode processing chambers and other surfaces that are exposed to the plasma. This corrosion may generate particles, which frequently contaminate the substrate that is being processed, contributing to device defects.

As device geometries shrink, susceptibility to defects increases and particle contaminant requirements become more stringent. Accordingly, as device geometries shrink, allowable levels of particle contamination may be reduced. To minimize particle contamination introduced by plasma etch and/or plasma clean processes, chamber materials have been developed that are resistant to plasmas. Different materials provide different material properties, such as plasma resistance, rigidity, flexural strength, thermal shock resistance, and so on. Also, different materials have different material costs. Accordingly, some materials have superior plasma resistance, other materials have lower costs, and still other materials have superior flexural strength and/or thermal shock resistance.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Embodiments of the invention are directed to an article, e.g., a plasma screen, a liner kit, showerhead, lid, electrostatic chuck, or other chamber components exposed to reducing plasma chemistry for a semiconductor processing chamber, including Al or $Al_2O_3$ or SiC substrate, and a ceramic coating on the article. In one embodiment, the ceramic coating is a composite ceramic, including a compound of $Y_4Al_2O_9$ (YAM) and a solid solution of $Y_2\text{-}xZr_xO_3$, wherein the ceramic coating is resistant to reducing chemistry ($H_2$, CO, COS, $CH_4$ etc).

A method of coating the ceramic coating on the article includes providing a plasma spraying system having a plasma current in the range of between about 90 A to about 150 A, and positioning a torch standoff of the plasma spraying system a distance from an article between about 60 mm and about 120 mm. The method also includes flowing gas through the plasma spraying system at a rate of between about 80 L/min and about 130 L/min, and plasma spray coating the article with a ceramic coating.

Figure 1:
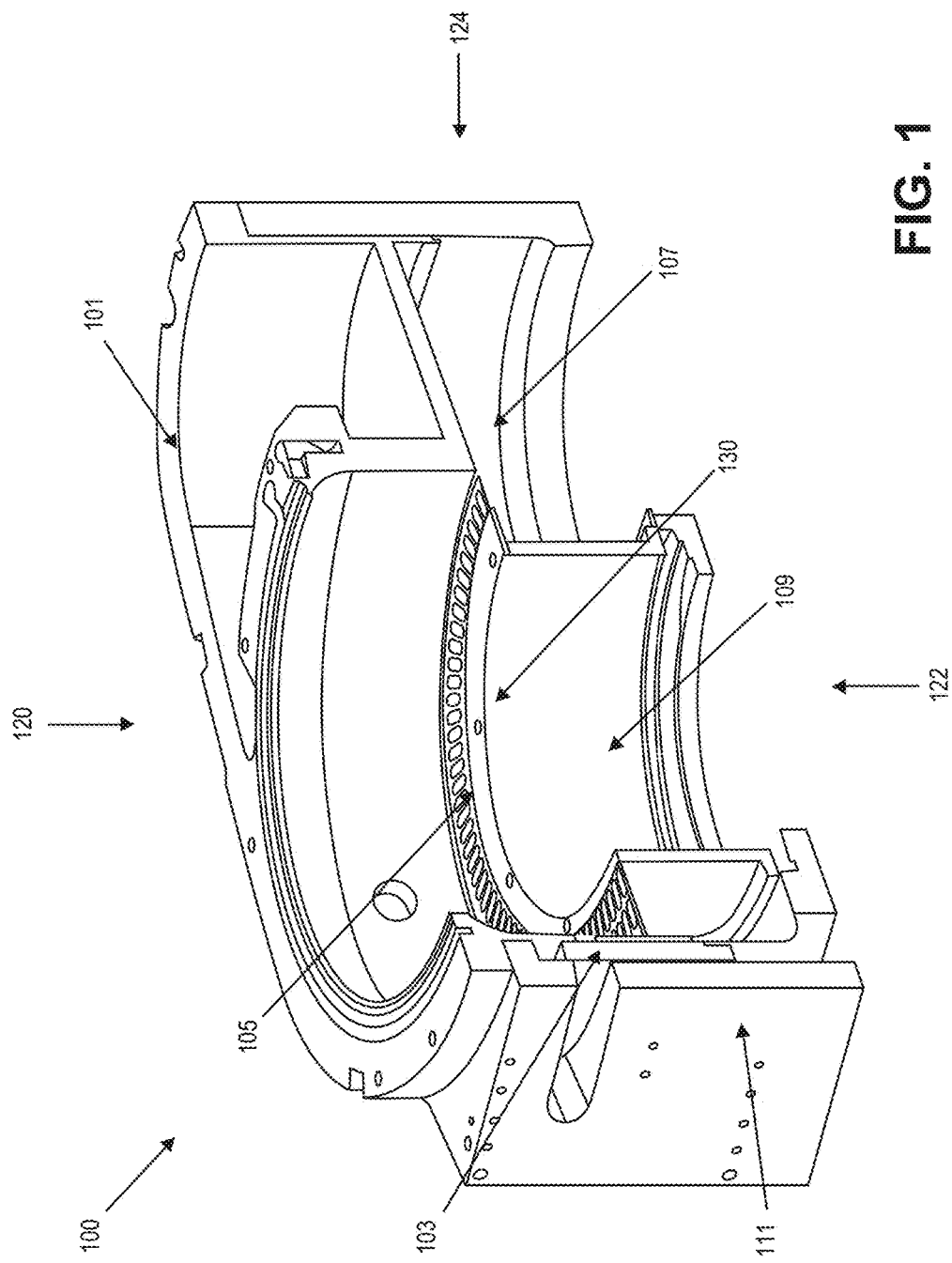
FIG. 1 illustrates a cross-sectional view of a liner kit.

The conductor etch process involves plasma assisted etching of a conductive substrate such as Si wafer by a gas mixture. In conductor etch, on-wafer level particle performance is primarily correlated to chamber critical components, especially the liner kit 100 with a front side 120, a back side 122, and an outer diameter 124, which can include a chamber body 111, an upper liner 101, slit valve door 103, plasma screen 105 (i.e., the grill-like structure around the wafer), lower liner 107 and cathode liner 109, as shown in FIG. 1. The upper liner 101, slit valve door 103 and lower liner 107 are closer to the chamber body 111, whereas the plasma screen 105 is located around a wafer (not shown, but is located at position 130 during operation) and the cathode liner 109 sits below the wafer.

A standard liner kit may be made up of an Al substrate coated with 8-12 mil of plasma sprayed $Y_2O_3$ (yttria) or other ceramic with a surface roughness of about 100-270 μin. For most typical semiconductor applications, an on-wafer particle specification is a maximum of about 30 adders (e.g., stray particles located on the wafer) at greater than or equal to 90 nm particle size. A standard $Y_2O_3$ liner kit meets this on-wafer particle specification.

For specific advanced applications at a 28 nm device nodes, the on-wafer particle specification is much more stringent at less than or equal to 1.3 adders at greater than or equal to 45 nm size. Moreover, these applications may use reducing chemistry ($H_2$, $CH_4$, CO, COS, etc), which often increases on-wafer particle contamination. Chamber tests using conventional $Y_2O_3$ coated liner kits under reducing chemistry show high on-wafer particles (e.g., about 50 to 100 or more adders at greater than or equal to 45 nm particle size), though significant chamber seasoning (e.g., 100 to 150 radio frequency RF hours of processing) can reduce the particle defect level down to about 0 to 10 adders at greater than or equal to 45 nm particle size to meet the production specifications before production can resume. However, long chamber seasoning times can reduce productivity. In tests, energy dispersive X-ray spectroscopy has confirmed that conventional $Y_2O_3$-based on-wafer particles may originate from the liner kit.

Further, $Y_2O_3$ coatings are less stable under reducing chemistry (e.g., H2, CH4, CO, COS, etc.) and form significant Y—OH. Y—OH conversion results in volume change which results in shed particles that may found on the wafer. However, in the absence of reducing chemistry, $Y_2O_3$ is stable and does not shed particles.

Embodiments of the present invention include a composite ceramic coating material to increase compatibility with use of reducing chemistries, in order to improve on-wafer particle performance for chamber components in semiconductor industry applications. For example, in the liner kit application, the composite ceramic coating (e.g., a Yttria based composite ceramic coating) may be applied to the plasma facing side of the liner kit using a plasma spray technique. In other embodiments, a composite ceramic coating can be applied via aerosol deposition, slurry plasma, or other suitable techniques such as other thermal spraying techniques. In one example, the coating thickness on an Aluminum liner kit can be up to 25 mil. In another example, $Al_2O_3$ or other metal oxide substrates, where the coefficient of thermal expansion (CTE) of the coating is better matched to the CTE of the substrate, can have a thicker coating.

In one embodiment, the composite ceramic coating is composed of a compound $Y_4Al_2O_9$ (YAM) and a solid solution $Y_2-xZr_xO_3$ ($Y_2O_3$—$ZrO_2$ solid solution). In a further embodiment, the composite ceramic coating includes 62.93 mol % $Y_2O_3$, 23.23 mol % $ZrO_2$ and 13.94 mol % $Al_2O_3$. In another embodiment, the composite ceramic coating can include $Y_2O_3$ in a range of 50-75 mol %, $ZrO_2$ in a range of 10-30 mol % and $Al_2O_3$ in a range of 10-30 mol %. In other embodiments, other distributions may also be used for the composite ceramic coating. In one embodiment, the composite ceramic is a yttrium oxide containing solid solution that may be mixed with one or more of $ZrO_2$, $Al_2O_3$, $HfO_2$, $Er_2O_3$, $Nd_2O_3$, $Nb_2O_5$, $CeO_2$, $Sm_2O_3$, $Yb_2O_3$, or combination thereof.

Figures 12A, 12B:
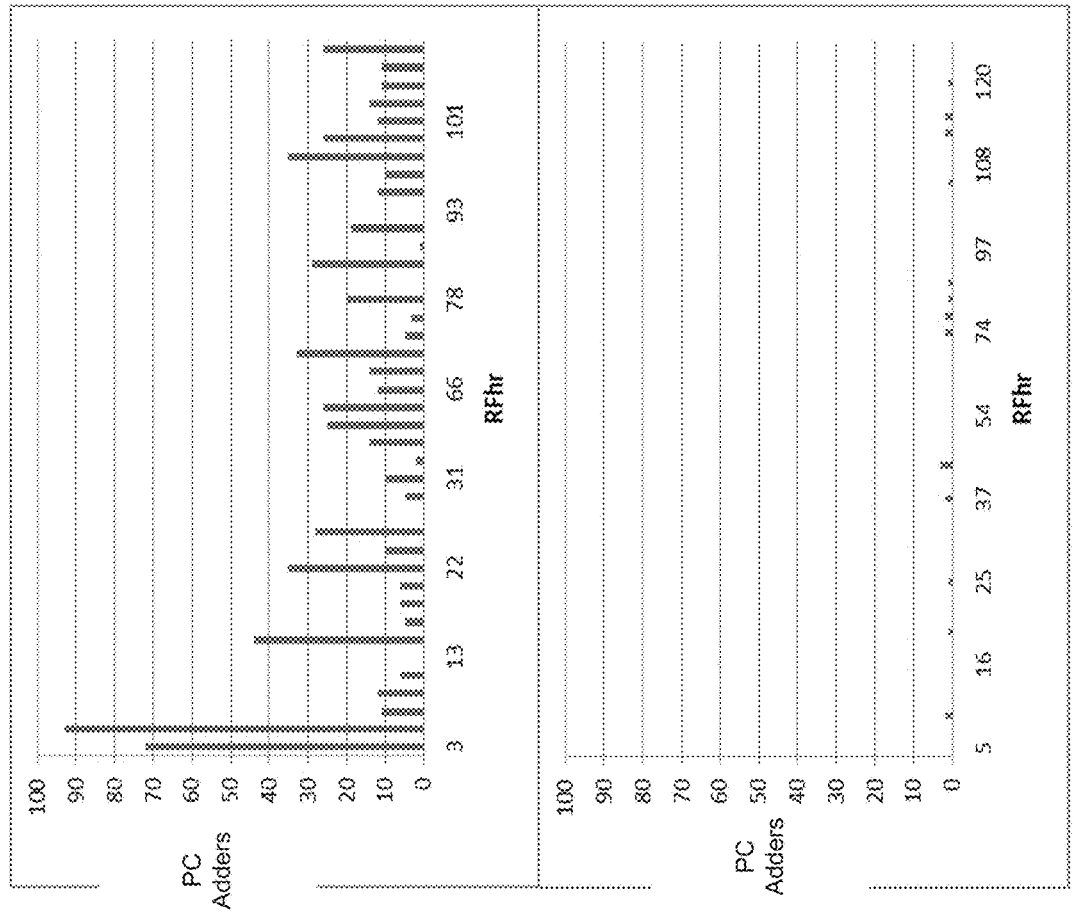
FIG. 12A illustrates particle performance of a coating over time.
FIG. 12B illustrates particle performance of a coating according to one embodiment.

During testing of various coatings, the on-wafer particle level was observed without CO and $H_2$ (non-reducing chemistry), and with CO and $H_2$ (i.e., under reducing chemistry). The composite ceramic coating exhibited better erosion resistance, particularly with reducing chemistry, than other coatings and bulk materials tested (e.g., bulk $Y_2O_3$, plasma sprayed (PS) $Y_2O_3$, SiC, columnar Si, single crystal Si, and $SiO_2$), showing a lower erosion rate (erosion depth per RFhr) than the other coatings tested. For example, FIG. 12A shows on-wafer particle performance of a $Y_2O_3$ coating for ≥45 nm particles over RF hours. Here, the coating showed a high number of YO particles in the initial phase (e.g., less than 20 RF hours), and 80 to 100 RF hours were required to reach a stable number of particles. FIG. 12B shows on-wafer particle performance of a composite ceramic coating for 45 nm particle over RF hours, where the coating did not show high numbers of YO particles during seasoning, and the number of YO particles was consistently low (i.e., less than 5 adders) at 60 RF hours.

Figure 2:
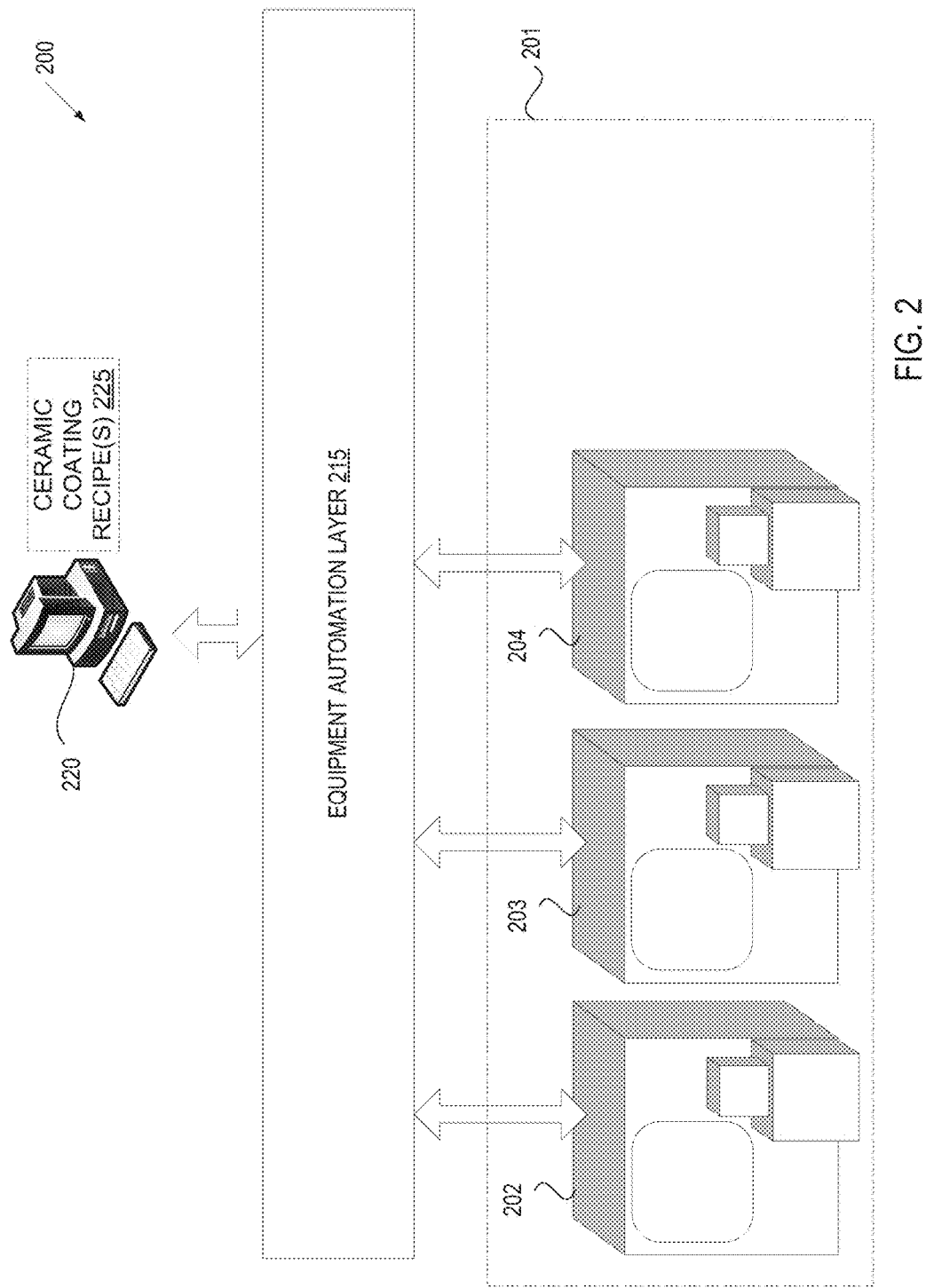
FIG. 2 illustrates an exemplary architecture of a manufacturing system.

FIG. 2 illustrates an exemplary architecture of a manufacturing system 200. The manufacturing system 200 may be a coating manufacturing system (e.g., for applying a composite ceramic coating to an article, such as a liner kit). In one embodiment, the manufacturing system 200 includes processing equipment 201 connected to an equipment automation layer 215. The processing equipment 201 may include a bead blaster 202, one or more wet cleaners 203, a plasma spray gun system 204 and/or other equipment. The manufacturing system 200 may further include one or more computing devices 220 connected to the equipment automation layer 215. In alternative embodiments, the manufacturing system 200 may include more or fewer components. For example, the manufacturing system 200 may include manually operated (e.g., off-line) processing equipment 201 without the equipment automation layer 215 or the computing device 220.

Bead blaster 202 is a machine configured to roughen the surface of articles (e.g., a liner kit). Bead blaster 202 may be a bead blasting cabinet, a hand held bead blaster, or other type of bead blaster. Bead blaster 202 may roughen a substrate by bombarding the substrate with beads or particles. In one embodiment, bead blaster 202 fires ceramic beads or particles at the substrate. The roughness achieved by the bead blaster 202 may be based on a force used to fire the beads, bead materials, bead sizes, distance of the bead blaster from the substrate, processing duration, and so forth. In one embodiment, the bead blaster uses a range of bead sizes to roughen the ceramic article.

In alternative embodiments, other types of surface rougheners than a bead blaster 202 may be used. For example, a motorized abrasive pad may be used to roughen the surface of ceramic substrates. A sander may rotate or vibrate the abrasive pad while the abrasive pad is pressed against a surface of the article. A roughness achieved by the abrasive pad may depend on an applied pressure, on a vibration or rotation rate and/or on a roughness of the abrasive pad.

Wet cleaners 203 are cleaning apparatuses that clean articles (e.g., a liner kit) using a wet clean process. Wet cleaners 203 include wet baths filled with liquids, in which the substrate is immersed to clean the substrate. Wet cleaners 203 may agitate the wet bath using ultrasonic waves during cleaning to improve a cleaning efficacy. This is referred to herein as sonicating the wet bath. In other embodiments, alternative types of cleaners such as dry cleaners may be used to clean the articles. Dry cleaners may clean articles by applying heat, by applying gas, by applying plasma, and so forth.

Ceramic coater 204 is a machine configured to apply a ceramic coating to the surface of a substrate. In one embodiment, ceramic coater 204 is a plasma sprayer (or plasma spray system) that plasma sprays a coating (e.g., a composite ceramic coating) onto the substrate (e.g., a liner kit). In alternative embodiments, the ceramic coater 204 may apply other thermal spraying techniques such as detonation spraying, wire arc spraying, high velocity oxygen fuel (HVOF) spraying, flame spraying, warm spraying and cold spraying may be used. Additionally, ceramic coater 204 may perform other coating processes such as aerosol deposition, electroplating, physical vapor deposition (PVD) and chemical vapor deposition (CVD) may be used to form the ceramic coating.

The equipment automation layer 215 may interconnect some or all of the manufacturing machines 201 with computing devices 220, with other manufacturing machines, with metrology tools and/or other devices. The equipment automation layer 215 may include a network (e.g., a location area network (LAN)), routers, gateways, servers, data stores, and so on. Manufacturing machines 201 may connect to the equipment automation layer 215 via a SEMI Equipment Communications Standard/Generic Equipment Model (SECS/GEM) interface, via an Ethernet interface, and/or via other interfaces. In one embodiment, the equipment automation layer 215 enables process data (e.g., data collected by manufacturing machines 201 during a process run) to be stored in a data store (not shown). In an alternative embodiment, the computing device 220 connects directly to one or more of the manufacturing machines 201.

In one embodiment, some or all manufacturing machines 201 include a programmable controller that can load, store and execute process recipes. The programmable controller may control temperature settings, gas and/or vacuum settings, time settings, etc. of manufacturing machines 201. The programmable controller may include a main memory (e.g., read-only memory (ROM), flash memory, dynamic random access memory (DRAM), static random access memory (SRAM), etc.), and/or a secondary memory (e.g., a data storage device such as a disk drive). The main memory and/or secondary memory may store instructions for performing heat treatment processes described herein.

The programmable controller may also include a processing device coupled to the main memory and/or secondary memory (e.g., via a bus) to execute the instructions. The processing device may be a general-purpose processing device such as a microprocessor, central processing unit, or the like. The processing device may also be a special-purpose processing device such as an application specific integrated circuit (ASiC), a field programmable gate array (FPGA), a digital signal processor (DSP), network processor, or the like. In one embodiment, programmable controller is a programmable logic controller (PLC).

In one embodiment, the manufacturing machines 201 are programmed to execute recipes that will cause the manufacturing machines to roughen a substrate, clean a substrate and/or article, coat a article and/or machine (e.g., grind or polish) a article. In one embodiment, the manufacturing machines 201 are programmed to execute recipes that perform operations of a multi-operation process for manufacturing a ceramic coated article, as described with reference to figures below. The computing device 220 may store one or more ceramic coating recipes 225 that can be downloaded to the manufacturing machines 201 to cause the manufacturing machines 201 to manufacture ceramic coated articles in accordance with embodiments of the present disclosure.

Figure 3:
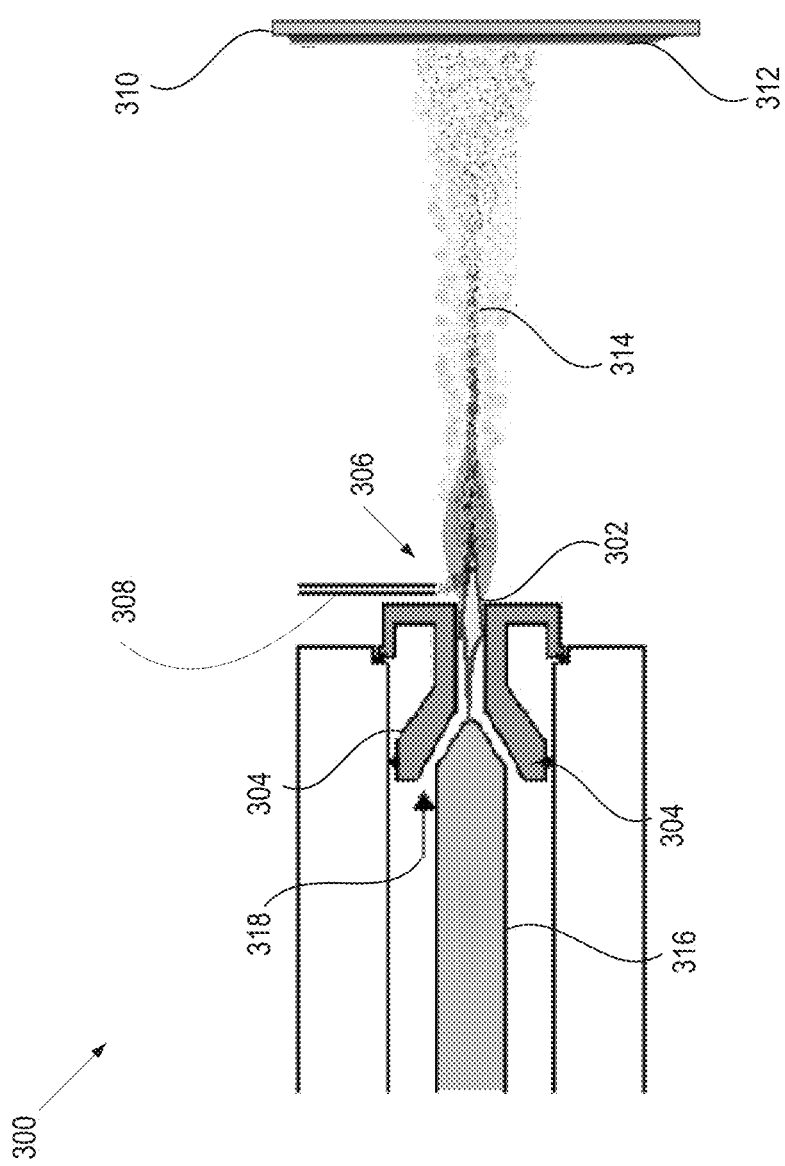
FIG. 3 illustrates a cross-sectional view of a plasma spray system.

FIG. 3 illustrates a cross-sectional view of a system 300 for plasma spraying a coating on a dielectric etch component, or other article (e.g., a liner kit) used in a corrosive system. The system 300 is a type of thermal spray system. In a plasma spray system 300, an arc 302 is formed between two electrodes, an anode 304 and a cathode 316, through which a gas 318 is flowing. Examples of gas suitable for use in the plasma spray system 300 include, but are not limited to, Argon/Hydrogen, Argon/Helium, or Argon/oxygen. As the gas is heated by the arc 302, the gas expands and is accelerated through the shaped nozzle 306, creating a high velocity plasma stream.

Powder 308 is injected into the plasma spray or torch where the intense temperature melts the powder and propels the material as a stream of molten particles 314 towards the article 310. Upon impacting the article 310, the molten powder flattens, rapidly solidifies, and forms a coating 312, which adheres to the article 310. The parameters that affect the thickness, density, and roughness of the coating 312 include type of powder, powder size distribution, powder feed rate, plasma gas composition, gas flow rate, energy input, torch offset distance, and substrate cooling.

Figure 4:
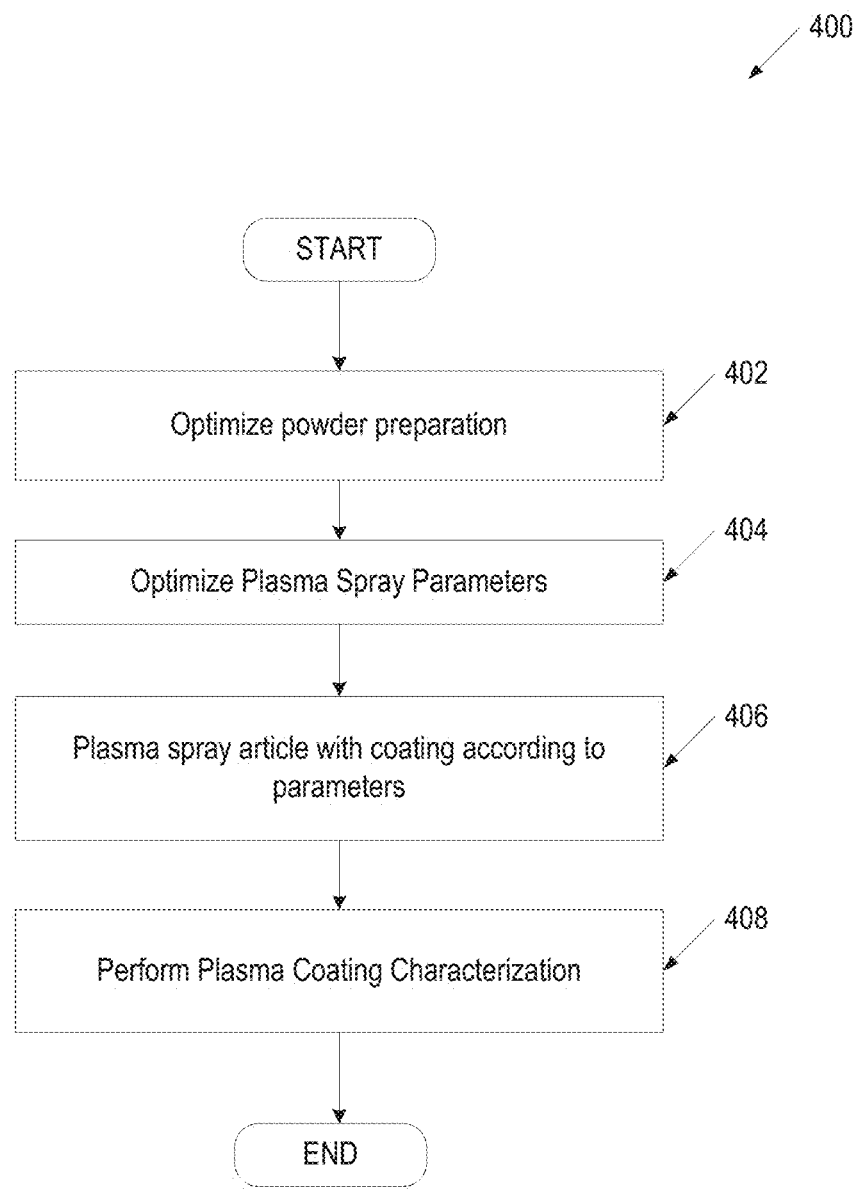
FIG. 4 illustrates a method of applying a coating to an article according to one embodiment.

FIG. 4 is a flow chart showing a process 400 for manufacturing a coated article, in accordance with an embodiment. The operations of process 400 may be performed by various manufacturing machines. The operations of process 400 will be described with reference to any article as described above, which may be used in a reactive ion etch or plasma etch system.

At block 402, the powder for plasma spraying a coating is optimized. This may include optimization of a powder shape and size distribution for a composite ceramic coating. In one embodiment, optimizing a coating includes, but is not limited, to determining powder type (e.g., chemical composition), average powder size, and a powder feed rate. The powder type may be selected to produce a composite ceramic coating as described previously. Raw ceramic powders having specified compositions, purity and particle sizes are selected. The ceramic powder may be formed of $Y_2O_3$, $Y_4Al_2O_9$, $Y_3Al_5O_{12}$ (YAG), or other yttria containing ceramics. Additionally, ceramic powder may be combined with one or more of $ZrO_2$, $Al_2O_3$, $HfO2$, $Er_2O_3$, $Nd_2O_3$, $Nb_2O_5$, $CeO_2$, $Sm_2O_3$, $Yb_2O_3$, or other oxides. The raw ceramic powders are then mixed. In one embodiment, raw ceramic powders of $Y_2O_3$, $Al_2O_3$ and $ZrO_2$ are mixed together for the composite ceramic coating. These raw ceramic powders may have a purity of 99.9% or greater in one embodiment. The raw ceramic powders may be mixed using, for example, ball milling. After the ceramic powders are mixed, they may be calcinated at a specified calcination time and temperature.

Figure 5:
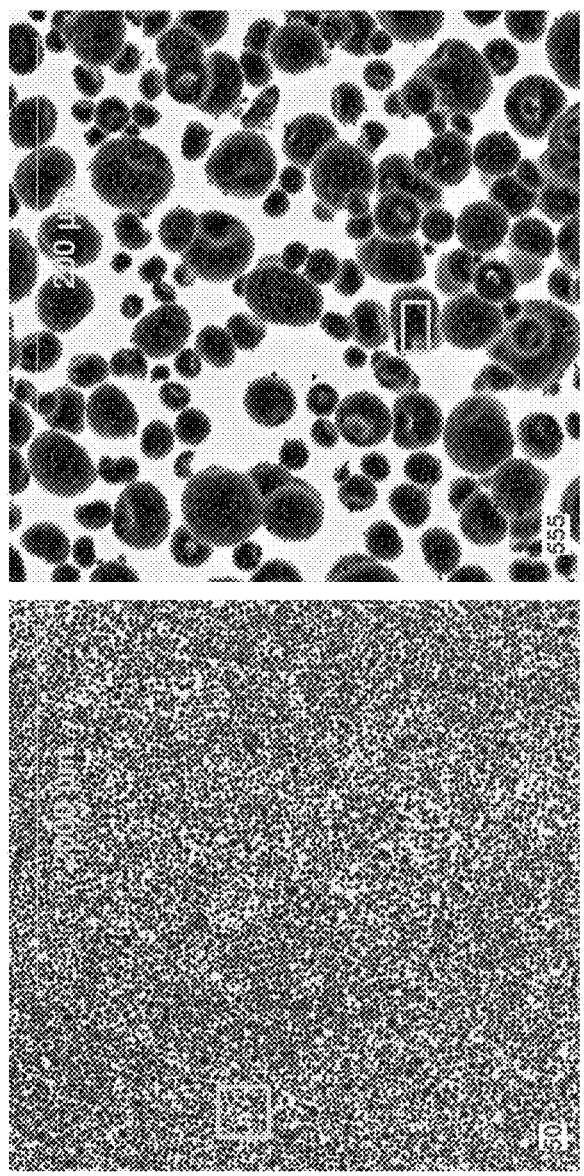
FIG. 5 illustrates powder shapes for a coating.

FIG. 5 shows an optimized powder particle shape for the coating according to one embodiment. Here, some of the particles have a spherical shape with deep indentions on opposite side of the sphere. In other words, most of the particles have a donut shape. Evaluations of coatings formed from powder with particles having a donut shape showed improved morphology and porosity as compared to powder particles of other shapes. For example, coatings formed of particles having a donut shape tend to have fewer nodules and more splat due to improved melting of the powders, decreased roughness, and decreased porosity, all of which contribute to improved on-wafer particle performance.

Figure 6A:
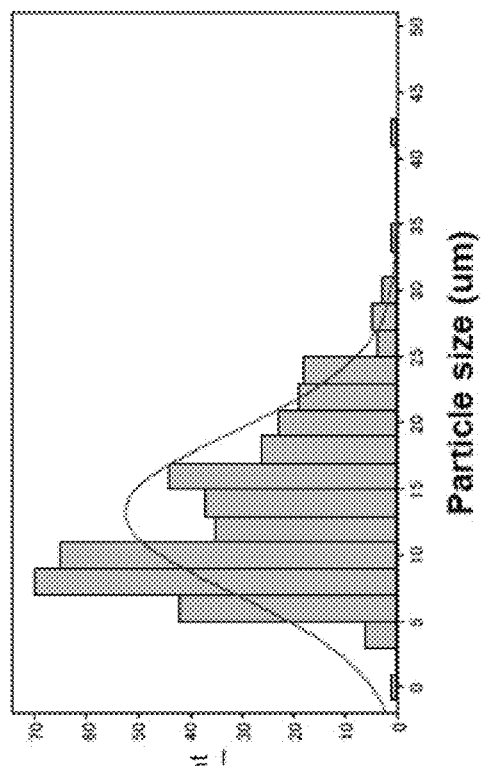
FIG. 6A illustrates a powder size distribution for a coating.
Figure 6B:
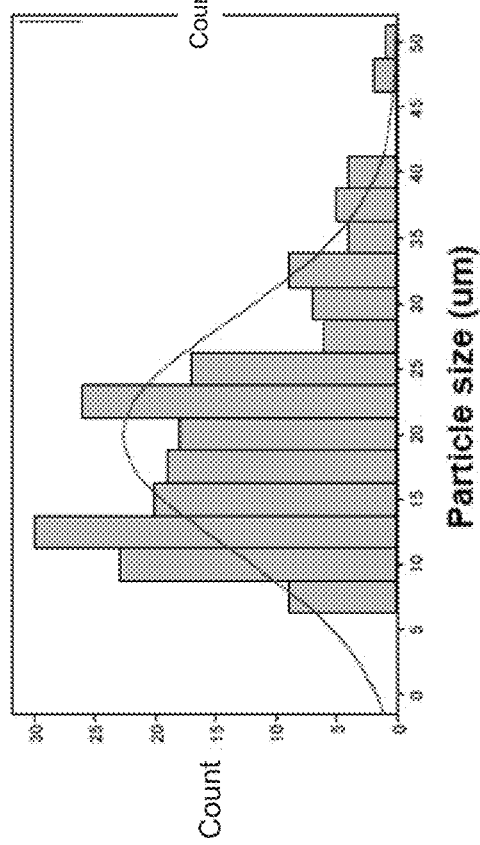
FIG. 6B illustrates a powder size distribution for a coating according to one embodiment.

FIG. 6A shows a powder particle size distribution histogram for powder that was evaluated based on coating surface morphology and porosity when the powder was applied as a coating. In FIG. 6A, the particle size (i.e., particle diameter) for 50% of the particles (D50) was about 25 microns or less. FIG. 6B shows an optimized powder particle size distribution histogram for powder that was also evaluated based on coating surface morphology and porosity when the powder was applied as a coating, in accordance with an embodiment. In FIG. 6B, the particle size for 50% of the particles (D50) was less than or equal to about 15 microns. Evaluations of coatings formed from powder with particle size for 50% of the particles being about 25 microns or less, as shown in FIG. 6A, showed improved morphology and porosity as compared to powders having larger particle sizes, both of which result in improved on-wafer particle performance.

Returning to FIG. 4, at block 404, the plasma spray parameters are optimized to maximize melting of the powders, reduce the number of surface nodules, increase splat surface, reduce roughness, and decrease porosity. In one embodiment, optimizing plasma spray parameters includes, but is not limited to, determining plasma gun power, and composition of spray carrier gas. Optimizing the plasma spray parameters may also include optimization of a spray coating sequence and process conditions for applying a coating (e.g., a composite ceramic coating) over a substrate (e.g., a plasma screen).

For example, Table A shows a coating process optimization (e.g., an orthogonal array evaluation) to assess and identify the effect of modifying coating parameters on coating surface morphology (e.g., nodules versus splats).

TABLE A

| Parameter | Level 1 | Level 2 | Level 3 |
|---|---|---|---|
| Powder (microns at D50) | 25 | 15 | — |
| Primary gas flow rate (L/min) | 80 | 90 | 130 |
| Secondary gas flow rate (%) | 40 | 54 | 57 |
| Plasma current (A) | 90 | 110 | 150 |
| Torch standoff distance (mm) | 60 | 80 | 120 |
| Powder injector (g/ml) | 10 | 80 | 100 |

Figure 7A:
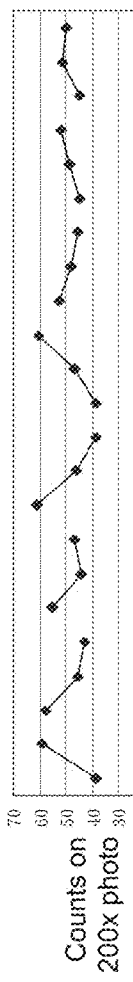
FIG. 7A illustrates nodule count of a coating according to one embodiment.
Figure 7B:
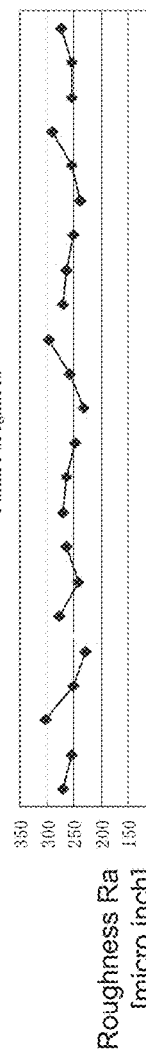
FIG. 7B illustrates surface roughness of a coating according to one embodiment.
Figure 7C:
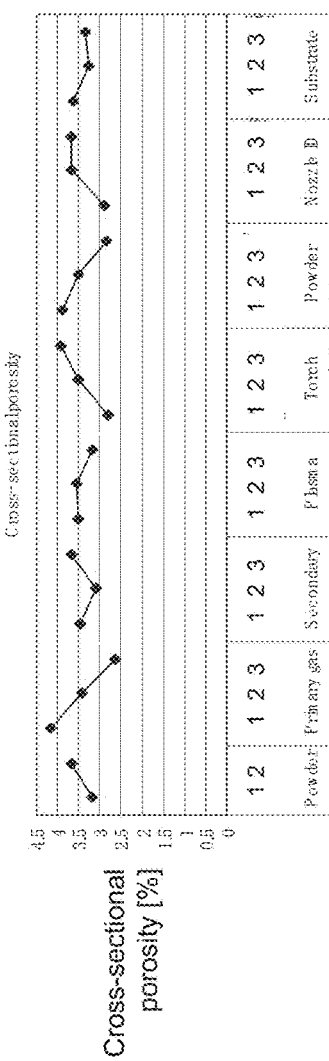
FIG. 7C illustrates a cross-sectional porosity of a coating according to one embodiment.

Here, examples of results of the evaluation are shown in FIGS. 7A, 7B, and 7C. FIG. 7A shows the number of nodules on a 200× zoom photo (e.g., a 200× scanning electron micrograph (SEM) of a one inch sample) for each of the levels for each of the parameters. In one example, the primary gas flow rate for level 1 (80 L/mi) results in a greater number of nodules (about 60) than the number of nodules (about 45) for the primary gas flow rate for level 2 (90 L/min). Further, the primary gas flow rate for level 2 results in a greater number of nodules than the number of nodules (about 43) for the primary gas flow rate for level 3 (130 L/min).

In another example, torch standoff distance for level 1 (60 mm) results in a greater number of nodules (about 39) than the number of nodules (about 58) for the torch standoff distance for level 2 (80 mm). Further, torch standoff distance for level 2 results in a greater number of nodules than the number of nodules (about 61) for the torch standoff distance for level 3 (120 mm).

FIG. 7B shows the average surface roughness (Ra) of a composite ceramic coating in micro-inches for each of the levels for each of the parameters. In one example, the plasma current level 1 (90 A) results in a greater roughness (about 260) than the roughness (about 255) for the plasma current level 2. Further, the plasma current for level 2 (110 A) results in a greater roughness than the roughness (about 250) for the plasma current level 3 (150 A).

FIG. 7C shows the cross-sectional porosity of the composite ceramic coating as a percentage for each of the levels for each of the parameters. In one example, the primary gas flow rate for level 1 (80 L/min) results in a greater porosity (about 4.2) than the porosity (about 3.4) for the primary gas flow rate for level 2 (90 L/min). Further, the primary gas flow rate for level 2 results in a greater porosity than the porosity (about 2.6)) for the primary gas flow rate for level 3 (130 L/min).

In one embodiment, the parameters are optimized to maximize melting, reduce the number of nodules (which can indicate an increase in melting of powder), increase splat surface (which can indicate an increase in melting of powder), reduce the surface roughness, and decrease the porosity of the coating, which will decrease the on-wafer particle count under reducing chemistry because particles are less likely to become dislodged. The analysis of Table A shows that the parameter levels that can optimize the coating are increasing the primary gas flow rate (e.g., about 130 L/min), increasing the plasma current (e.g., about 150 A), decreasing the torch standoff distance (e.g., about 60 mm), and increasing the diameter of the particles of the powder (e.g., about less than or equal to 25 micron particle diameter for 50% of the particles).

For example, an optimized plasma current can be in the range of between about 90 A to about 150 A. A further optimized plasma current can be in the range of between about 110 A to about 150 A. In another example, an optimized positioning of a torch standoff of the plasma spraying system can be a distance from the article (e.g., liner kit or plasma screen) between about 60 mm and about 120 mm. A further optimized positioning of a torch standoff can be a distance from the article between about 60 mm and about 90 mm. In yet another example, optimized gas flow through the plasma spraying system can be at a rate of between about 80 L/min and about 130 L/min. A further optimized gas flow through the plasma spraying system can be at a rate of between about 90 L/min and about 130 L/min.

In the example above, a coating on an article coated according to the further optimized parameter can have a nodule count of about 30 nodules to about 45 nodules per inch, a roughness of about 220 micro inch to about 250 micro inch, and a cross-sectional porosity of about 2.5% to about 3.2%.

Returning again to FIG. 4, at block 406, the article is coated according to the selected parameters. Thermal spraying techniques and plasma spraying techniques may melt materials (e.g., ceramic powders) and spray the melted materials onto the article using the selected parameters. The thermally sprayed or plasma sprayed ceramic coating may have a thickness about 5-40 mil (e.g., 25 mil in one embodiment). The thickness, in one example, is selected according to an erosion rate of the composite ceramic coating to ensure that the article has a useful life of at least approximately 5000 Radio Frequency Hours (RFHrs). In other words, if the erosion rate of a composite ceramic coating is about 0.005 mil/hr, then for a useful life of about 5000 RF hours, a ceramic coating having a thickness of about 25 mil may be formed.

The plasma spray process may be performed in multiple spray passes. For each pass, the angle of a plasma spray nozzle may change to maintain a relative angle to a surface that is being sprayed. For example, the plasma spray nozzle may be rotated to maintain an angle of approximately 45 degrees to approximately 90 degrees with the surface of the article being sprayed.

Figure 8:
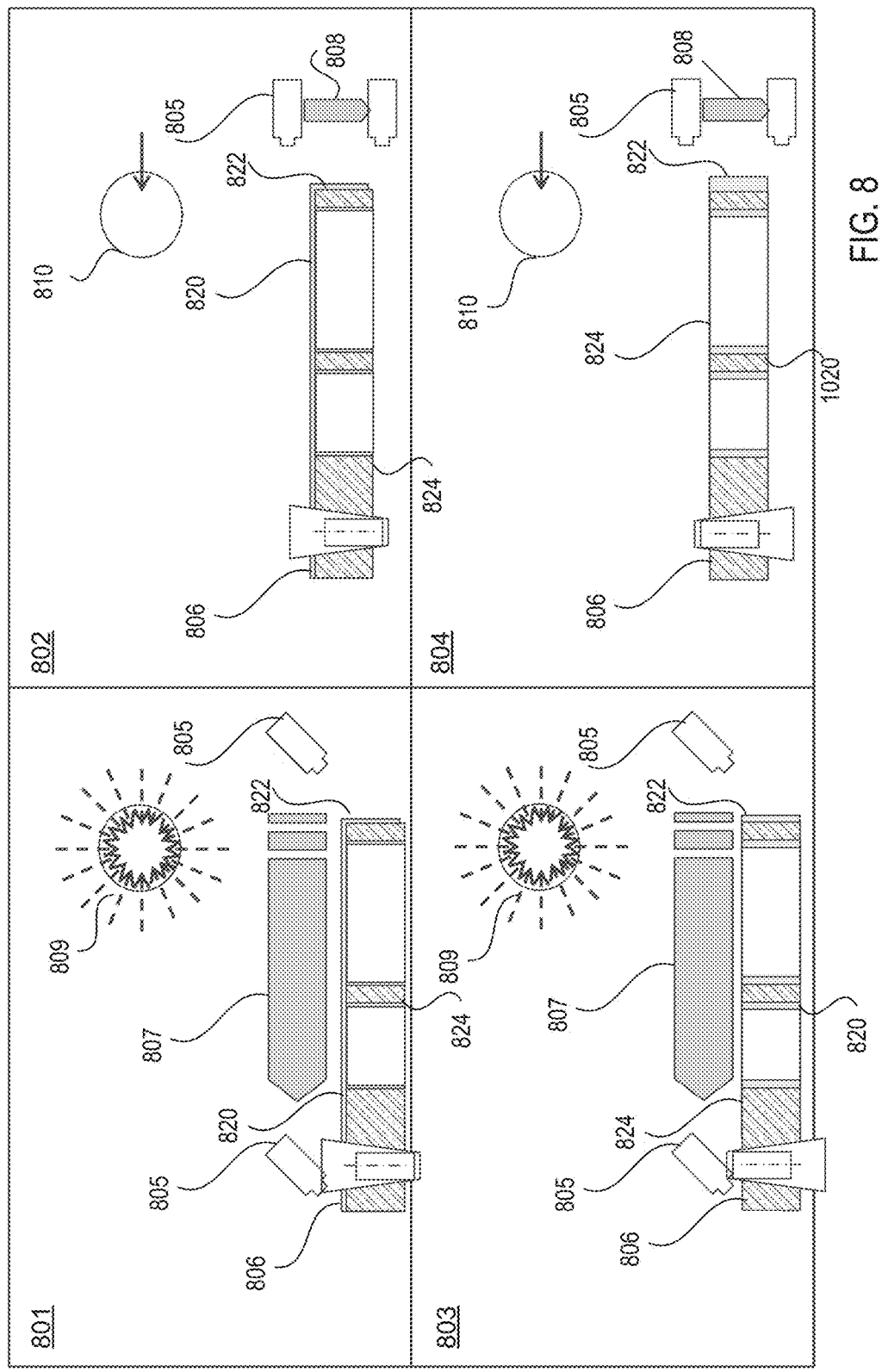
FIG. 8 illustrates application of a coating.

In one embodiment, the plasma spray sequence can be optimized to achieve an improved coating (e.g., less porosity, reduced surface nodules, and reduced surface roughness), as well as reduce re-deposition of stray particles on to the coating surface (mostly coming from backside coating of the article). FIG. 8 illustrates one example of an optimized spray sequence for a complex part, such as the plasma screen. First, as shown in block 801, a front side 820 of the article 806 (e.g., a plasma screen, where a partial cross-sectional view is shown in FIG. 8) is sprayed (or coated) at a 45 degree angle by moving a spraying system 805 (e.g., a plasma spray system) horizontally 807 across the article 806 while the article 806 is rotating, such that the spray is multi-directional 809. Here, the front side 820 of the article 806 is the side of the article 806 that will be facing the plasma spray system when the article 806 is installed in a chamber for semiconductor manufacturing. Second, as shown in block 802, the outer diameter 822 of the article 806 is sprayed (or coated) by moving the spraying system 805 vertically 808 beside the article 806 while the article 805 is rotating, such that the spraying is uni-directional 810. Third, as shown in block 803, after the article 806 is flipped, a back side 824 of the article 806 is sprayed (or coated) at a 45 degree angle by moving the spraying system 805 horizontally 807 across the article 806 while the article 806 is rotating, such that the spray is multi-directional 809. Fourth, at block 804, the outer diameter 822 of the article 806 is sprayed (or coated) by moving the spraying system 805 vertically 808 beside the article 806 while the article 806 is rotating, such that the spraying is uni-directional 810.

In an example, the coating can be up to about 8 mil thick. However, because the coating is applied thickly in a single coating operation for each side, coating that is not properly adhered can build up along the edges of the article, such that coating particles can dislodge during manufacturing and degrade on-wafer particle performance. Further, because the back side is coated after the front side (which faces the plasma during etch) circulating particulate from the coating of the back side can loosely adhere to the coating on the front side of the article, such that coating particles can dislodge during manufacturing and also degrade on-wafer particle performance.

Figure 9:
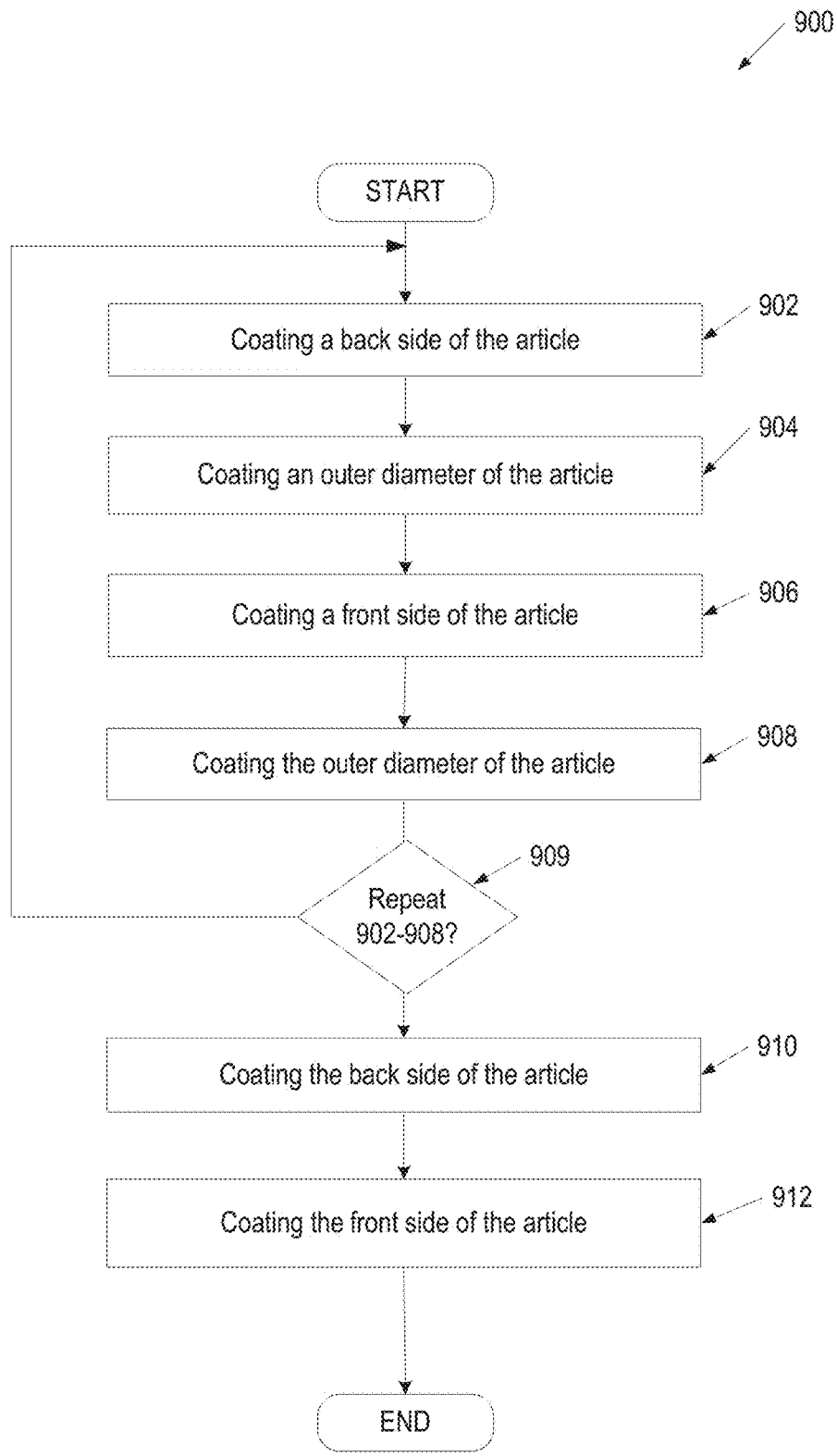
FIG. 9 illustrates a method of applying a coating according to one embodiment.

FIG. 9 illustrates a method 900 of spraying an article (e.g., the plasma screen) according to one embodiment. In a spray sequence according to one embodiment, e.g., a continued improvement process (CIP) #1, in operation 902, as shown in block 803 of FIG. 8, the back side 824 of an article 806 is sprayed (or coated) at a 45 degree angle by moving the spraying system 805 (e.g., a plasma spray gun) perpendicularly 807 to the axis of rotation of the article 806 (e.g., horizontally) across the article 806 while the article 806 is rotating, such that the spray is multi-directional 809. In one embodiment, the spraying system is stationary and the article is moved.

In operation 904, as shown in block 802, the outer diameter 822 of the article 806 is sprayed (or coated) by moving the spraying gun 805 parallel 808 to the axis of rotation of the article 806 (e.g., vertically) beside the article 806 while the article 806 is rotating, such that the spraying is uni-directional 810. In one embodiment, the spraying system is stationary and the article is moved.

In operation 906, as shown in block 801, the article 806 is flipped, and the front side 820 of the article 806 is sprayed (or coated) at a 45 degree angle by moving the spraying system 805 perpendicularly 807 to the axis of rotation of the article 806 (e.g., horizontally) across the article 806 while the article 806 is rotating, such that the spray is multi-directional 809. In one embodiment, the spraying system is stationary and the article is moved.

In operation 908, as shown in block 802, the outer diameter of the article 806 is again sprayed (or coated) by moving the spraying system 805 parallel 808 to the axis of rotation of the article (e.g., vertically) beside the article 806 while the article 806 is rotating, such that the spraying is uni-directional 810.

At block 909, it is determined whether to repeat the sequence of blocks 902-908. In one embodiment, the sequence is repeated one time. If the sequence is to be repeated, the process returns to block 902, and spraying continues in a sequence of flip article, operation 902, operation 904, flip article, operation 906, and operation 908. If the operations of blocks 902-908 are not to be repeated at block 909, then spraying continues in a sequence of flip article, coat the back side of the article at operation 910, flip article, and coat front side of article at operation 912.

Since the outer diameter is sprayed fewer times than the front side and back side, the coating on the front side and the back side is thicker than the coating on the outer diameter, such that there is less build up of the coating at the edges of the article. Further, since the coating is applied in multiple layers, there is also less likely to be build up of the coating at the edges of the article. Reduced build up at the edges of the article improves particle performance because there is less improperly adhered coating at the edges of the article from which particles can dislodge. Further, since the front side (which faces the plasma during etching) is coated last, the surface of the coating is less likely to have circulating particles from the coating of other surfaces improperly adhered which could dislodge and degrade particle performance.

Another spray sequence, e.g., CIP #2, according to one embodiment, includes operation 902, operation 904, operation 906, flipping the article 806, and operation 908. Here, operations 902, 904, 906, and 908 are not repeated. Rather, spraying may continue in a sequence of flip article 806, operation 902, operation 904, flip article 806, and operation 906. Next, spraying continues in a sequence of flip article 806, operation 902, flip article 806, and operation 906. CIP #2 is different from CIP #1 because the outer diameter of the article is coated even fewer times in CIP #2 than CIP #1.

Since the outer diameter is sprayed fewer times than the front side and back side, in one embodiment, the coating on the front side and the back side may be thicker than the coating on the outer diameter, such that there is less build up of the coating at the edges of the article. Further, since the coating is applied in multiple layers, there is also less likely to be build up of the coating at the edges of the article. Reduced build up at the edges of the article improves particle performance because there is less improperly adhered coating at the edges of the article from which particles can dislodge. Further, since the front side (which faces the plasma during etching) is coated last, the surface of the coating is less likely to have circulating particles from the coating of other surfaces improperly adhered which could dislodge and degrade on-wafer particle performance.

Figure 10:
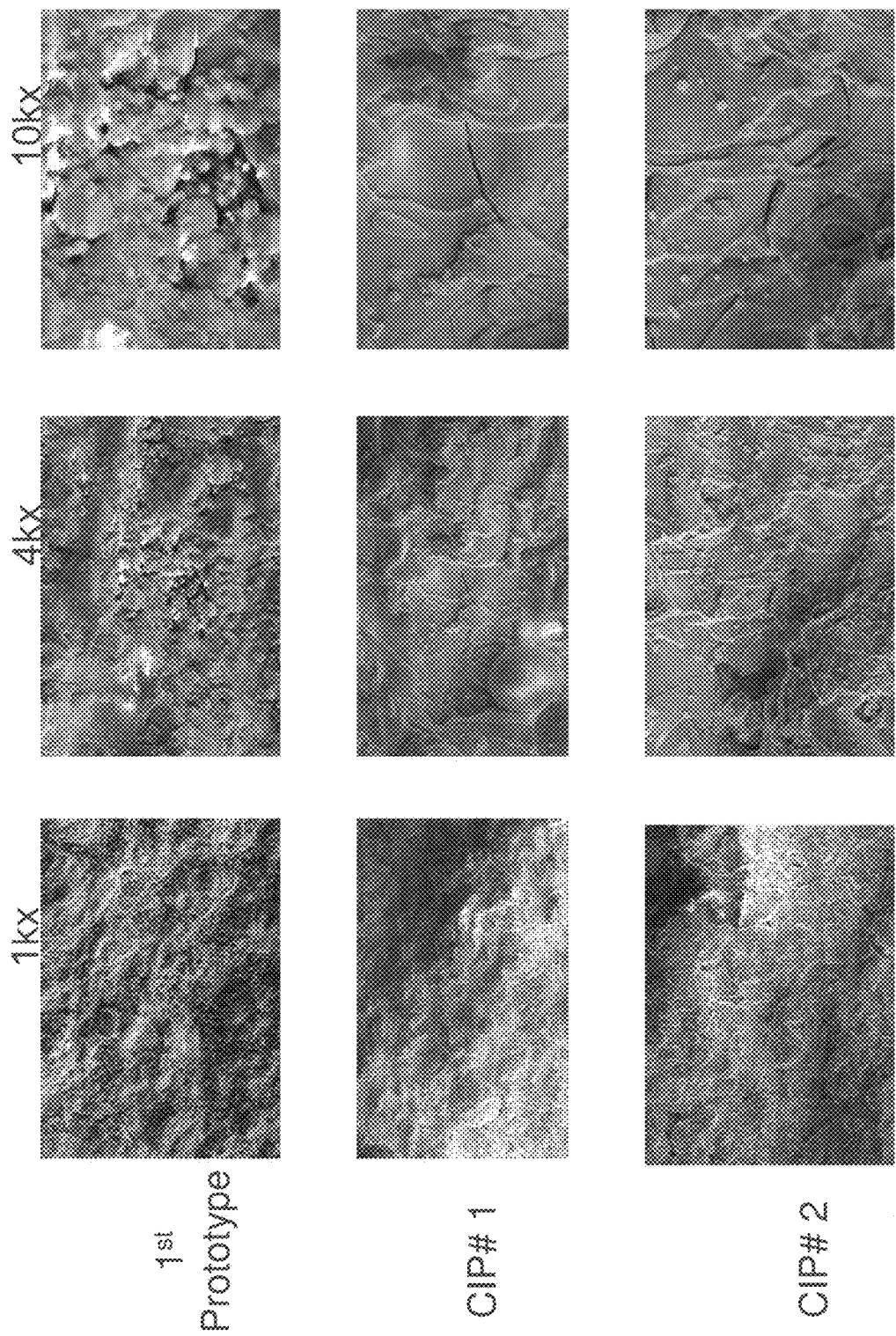
FIG. 10 illustrates scanning electron microscope (SEM) views of coating surface.
Figure 11:
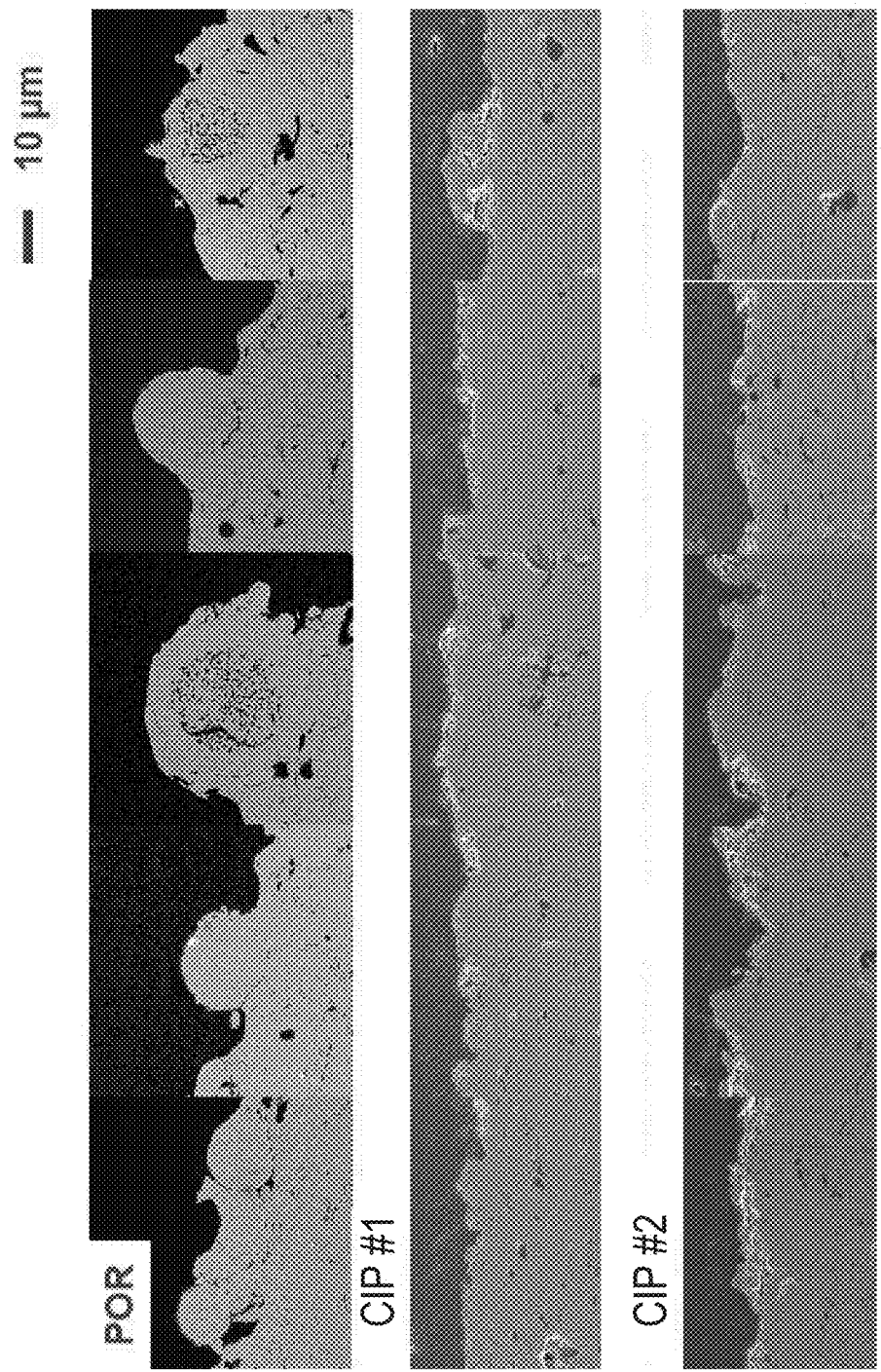
FIG. 11 illustrates SEM views of cross-sections of coatings.

Referring again to FIG. 4, at block 408, plasma coating characterization may be performed. This may include determining a surface morphology, a roughness, a porosity, identifying surface nodules, and so forth. For example, FIG. 10 shows an SEM view of three examples, 1st prototype, CIP #1, and CIP #2, of coatings at three magnifications 1000×, 4000×, and 10000×. In this example, CIP #2 displays a more preferred surface morphology with a lower roughness and fewer surface nodules. Also, FIG. 11 shows an SEM view of a cross-section of examples of coatings, where the number of nodules along a one inch sample are counted at 2000× magnification. In this example, CIP #2 displays fewer surface nodules.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or."

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
   setting plasma current for a plasma spraying system to between about 90 A and about 150 A;
   positioning a torch standoff of the plasma spraying system to a distance from an article between about 60 mm and about 120 mm;
   flowing gas through the plasma spraying system at a rate of between about 80 L/min and about 130 L/min;
   feeding powder comprising a yttrium-based oxide into the plasma spraying system, wherein the powder comprises a majority of donut-shaped particles, each of the donut-shaped particles having a spherical body with indentations on opposite sides of the spherical body; and
   plasma spray coating the article to apply a ceramic coating onto the article, wherein the ceramic coating comprises the yttrium-based oxide, wherein the donut-shaped particles cause the ceramic coating to have an improved surface morphology and a decreased porosity as compared to powder particles having a spherical shape, wherein the improved surface morphology comprises a reduced amount of surface nodules.

2. The method of claim 1, wherein the yttrium-based oxide comprises a compound of $Y_4Al_2O_9$ (YAM) and a solid solution of $Y_2O_3$—$ZrO_2$.

3. The method of claim 2, wherein the compound comprises $Y_2O_3$ in a range from about 50 mol % to about 75 mol %, $ZrO_2$ in a range from about 10 mol % to about 30 mol %, and $Al_2O_3$ in a range from about 10 mol % to about 30 mol %.

4. The method of claim 1, wherein the ceramic coating comprises about 62.93 mol % $Y_2O_3$, about 23.13 mol % $ZrO_2$, and about 13.94 mol % $Al_2O_3$.

5. The method of claim 1, wherein the amount of nodules per inch is in a range from about 30 nodules to about 45 nodules.

6. The method of claim 1, wherein the decreased porosity is in a range from about 2.5% to about 3.2%.

7. The method of claim 1, further comprising:
   setting plasma current for the plasma spraying system to between about 110 A and about 150 A.

8. The method of claim 1, wherein about 50% of the powder has a diameter less than about 15 microns.

9. The method of claim 1, further comprising:
   rotating the article to expose a plurality of portions of the article while plasma spray coating the article.

10. The method of claim 9, wherein the plasma spray coating comprises applying one or more coats by:
    coating a back side of the article, wherein the coating is applied at a 45 degree angle to the rotating article as the plasma spray system is moved perpendicular to an axis of rotation of the article, and the back side coating having a thickness about 2 mil;
    coating an outer diameter of the article, wherein the coating is applied horizontally to the rotating article as the plasma spray system is moved parallel to the axis of rotation of the article, and the outer diameter coating is applied about 2 mil thick; and
    coating a front side of the article, wherein the article is flipped and the coating is applied at an approximately 45 degree to the rotating article as the plasma spray system is moved perpendicular to an axis of rotation of the article, and the front side coating is applied about 2 mil thick.

11. The method of claim 1, wherein the article comprises a plasma screen for a semiconductor processing chamber, wherein the plasma screen comprises at least one of Al, $Al_2O_3$, or SiC.

12. The method of claim 1, further comprising:
    maintaining an angle of approximately 45 degrees between a plasma spray nozzle and a surface of the article while plasma spray coating the article.

13. The method of claim 12, wherein maintaining the angle of approximately 45 degrees comprises rotating at least one of the plasma spray nozzle or the article while plasma spray coating the article.

14. The method of claim 1, wherein the article comprises a front side, a back side and an outer diameter, and wherein a thickness of the ceramic coating on the front side and on the back side is greater than a thickness of the ceramic coating on the outer diameter.

15. The method of claim 1, further comprising:
    performing a first number of plasma spray passes on a first portion of the article; and
    performing a second number of plasma spray passes on a second portion of the article, wherein the first number is greater than the second number.

16. The method of claim 1, wherein a surface roughness of the ceramic coating is from about 220 micro-inches to about 250 micro-inches.

17. A method comprising:
    setting plasma current for a plasma spraying system to between about 90 A and about 150 A;
    positioning a torch standoff of the plasma spraying system to a distance from a body between about 60 mm and about 120 mm;
    flowing gas through the plasma spraying system at a rate of between about 80 L/min and about 130 L/min;
    feeding powder comprising $Y_2O_3$, $ZrO_2$, and $Al_2O_3$ into the plasma spraying system, wherein the powder comprises a majority of donut-shaped particles, each of the donut-shaped particles having a spherical body with indentations on opposite sides of the spherical body; and
    plasma spray coating an article to apply a ceramic coating onto the article, wherein the ceramic coating comprises a compound of $Y_4Al_2O_9$ (YAM) and a solid solution of $Y_2O_3$—$ZrO_2$, wherein the donut-shaped particles cause the ceramic coating to have an improved surface morphology, a reduced surface roughness and a decreased porosity as compared to powder particles having a spherical shape, wherein the improved surface morphology comprises a reduced amount of surface nodules.

18. A method comprising:

setting plasma current for a plasma spraying system to between about 90 A and about 150 A;

positioning a torch standoff of the plasma spraying system to a distance from a body between about 60 mm and about 120 mm;

flowing gas through the plasma spraying system at a rate of between about 80 L/min and about 130 L/min;

feeding powder comprising a yttrium-containing oxide into the plasma spraying system, wherein the powder comprises a majority of donut-shaped particles, each of the donut-shaped particles having a spherical body with indentations on opposite sides of the spherical body; and plasma spray coating an article to apply a ceramic coating onto the article, wherein the ceramic coating comprises a compound of $Y_4Al_2O_9$ (YAM) and a solid solution of $Y_2O_3$—$ZrO_2$, the compound comprising $Y_2O_3$ in a range from about 50 mol % to about 75 mol %, $ZrO_2$ in a range from about 10 mol % to about 30 mol %, and $Al_2O_3$ in a range from about 10 mol % to about 30 mol %, wherein the donut-shaped particles cause the ceramic coating to have an improved surface morphology, a reduced surface roughness and a decreased porosity as compared to powder particles having a spherical shape, wherein the improved surface morphology comprises a reduced amount of surface nodules.

* * * * *